(12) United States Patent
Sharma et al.

(10) Patent No.: US 11,296,229 B2
(45) Date of Patent: Apr. 5, 2022

(54) VERTICAL THIN FILM TRANSISTORS HAVING SELF-ALIGNED CONTACTS

(71) Applicant: Intel Corporation, Santa Clara, CA (US)

(72) Inventors: Abhishek A. Sharma, Hillsboro, OR (US); Yih Wang, Portland, OR (US); Van H. Le, Portland, OR (US); Jack T. Kavalieros, Portland, OR (US); Tahir Ghani, Portland, OR (US); Nazila Haratipour, Hillsboro, OR (US); Benjamin Chu-Kung, Portland, OR (US); Seung Hoon Sung, Portland, OR (US); Gilbert Dewey, Beaverton, OR (US); Shriram Shivaraman, Hillsboro, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 16/022,494

(22) Filed: Jun. 28, 2018

(65) Prior Publication Data

US 2020/0006572 A1 Jan. 2, 2020

(51) Int. Cl.
*H01L 29/786* (2006.01)
*H01L 29/417* (2006.01)
(Continued)

(52) U.S. Cl.
CPC .. *H01L 29/78642* (2013.01); *H01L 29/41733* (2013.01); *H01L 29/41741* (2013.01);
(Continued)

(58) Field of Classification Search
CPC ........... H01L 21/76897; H01L 21/8234; H01L 21/823412; H01L 21/823418; H01L 21/823462; H01L 21/823468; H01L 21/823487; H01L 21/823807; H01L 21/823814; H01L 21/823857; H01L 21/823864; H01L 21/823885; H01L 29/41725; H01L 29/41733; H01L 29/41741; H01L 29/42384; H01L 29/4908; H01L 29/66553; H01L 29/66666;
(Continued)

(56) References Cited

U.S. PATENT DOCUMENTS 6,737,710 B2 * 5/2004 Cheng ............... H01L 29/41775
257/382

* cited by examiner

*Primary Examiner* — Cheung Lee
(74) *Attorney, Agent, or Firm* — Schwabe, Williamson & Wyatt, P.C.

(57) ABSTRACT

Thin film transistors are described. An integrated circuit structure includes a first source or drain contact above a substrate. A gate stack pedestal is on the first source or drain contact, the gate stack pedestal including a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer. A channel material layer is over and along sidewalls of the gate stack pedestal, the channel material layer further on a portion of the first source or drain contact. Dielectric spacers are adjacent portions of the channel material layer along the sidewalls of the gate stack pedestal. A second source or drain contact is over a portion of the channel material layer over the gate stack pedestal.

20 Claims, 8 Drawing Sheets

(51) Int. Cl.
  *H01L 29/423* (2006.01)
  *H01L 29/66* (2006.01)
  *H01L 29/49* (2006.01)
(52) U.S. Cl.
  CPC .... *H01L 29/42384* (2013.01); *H01L 29/4908* (2013.01); *H01L 29/6675* (2013.01); *H01L 29/66553* (2013.01); *H01L 29/66969* (2013.01); *H01L 29/78696* (2013.01); *H01L 29/7869* (2013.01); *H01L 2029/42388* (2013.01)
(58) Field of Classification Search
  CPC ........... H01L 29/6675; H01L 29/66969; H01L 29/7827; H01L 29/78642; H01L 29/7869; H01L 29/78696; H01L 2029/42388
  See application file for complete search history.

VERTICAL THIN FILM TRANSISTORS HAVING SELF-ALIGNED CONTACTS

TECHNICAL FIELD

Embodiments of the disclosure are in the field of integrated circuit structures and, in particular, vertical thin film transistors having self-aligned contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
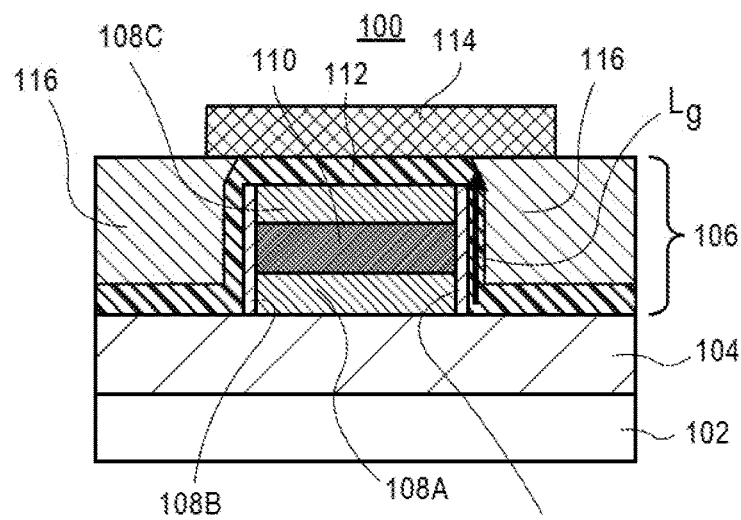
FIGS. 1A and 1B illustrate cross-sectional views of various operations in a method of fabricating a vertical thin film integrated circuit structure.

Vertical thin film transistors (TFTs) having self-aligned contacts are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC)

fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating BEOL thin film transistors (TFTs) having relatively increased channel length relative to TFTs of conventional geometry. Embodiments may include or pertain to one or more of back end transistors, semiconducting oxide materials, thin film transistors, and system-on-chip (SoC) technologies. One or more embodiments may be implemented as a transistor for and eDRAM structure, such as a one transistor-one capacitor 1T-1C vertical TFT-based eDRAM structure. One or more embodiments may be implemented to realize high performance backend transistors to potentially increase monolithic integration of backend logic plus memory in SoCs of future technology nodes.

To provide context, there is increased need for advanced SoCs to include monolithically integrated BEOL transistors for logic functionality at higher metal layers. Such BEOL transistors typically have a lower thermal budget than front end transistors due to increased thermal sensitivity of back-end materials. Also, the performance of such transistors may be severely hampered due to low channel mobility for BEOL-compatible channel materials.

In accordance with one or more embodiments described herein, non-planar BEOL-compatible thin film transistors (TFTs) are fabricated by effectively increasing the transistor channel length for a given projected area. A TFT fabricated using such an architecture may exhibit an increase in gate control, stability, and performance of thin film transistors. Applications of such systems may include, but are not limited to, back end (BEOL) logic, memory, or analog applications. Embodiments described herein may include non-planar structures that effectively increase transistor length (relative to a planar device) by integrating the devices in unique architectures.

In an embodiment, very long channel thin film transistors are implemented into an integrated circuit with high area/footprint efficiency. Such long-channel structures may be useful for low-leakage/low power applications. In particular embodiments, a three-dimensional thin film semiconductor is gated from a gate stack pedestal to provide a channel length which is varied depending on the height of the gate stack pedestal. In one embodiment, very long channel TFT devices are described that do not have an area penalty that would typically be associated with other TFT devices. TFT devices described herein may be integrated anywhere within a semiconductor die (e.g., above an existing layer of devices, adjacent to existing devices, etc.). For ease of illustration, some devices are described herein in an isolated environment without other features present. Such other features would be apparent to one skilled in the art.

In accordance with one or more embodiments of the present disclosure, passivation defined self-aligned contacts are described for implementation with vertical TFTs. It is to be appreciated that contact formation is a key process for achieving high drive current (which can depend on contact resistance). Moreover, if such contacts are non-self-aligned, there is a possibility of shorting to an adjacent device and/or increasing parasitic capacitance. In an embodiment, a method to improve alignment of source and drain contacts (e.g., with respect to an underlying channel material layer) during patterning and to reduce a number of mask operations needed to define a TFT periphery is described. In a particular embodiment, a non-etchable layer formed on gate pedestal sidewalls are used to guide contact periphery definition at the edge of the cell.

To provide context, state-of-the-art vertical transistors (1) may require up to 1.5-2 pitch definition, (2) may suffer from misalignment induced shorting and bitline-cap coupling which increases noise, and/or (3) may require an extra mask to separate cap-via contact and bitline metal contact. It is also to be appreciated that misalignment issues may cause shorting and channel resistance (Rc) variability.

Figure 1B:
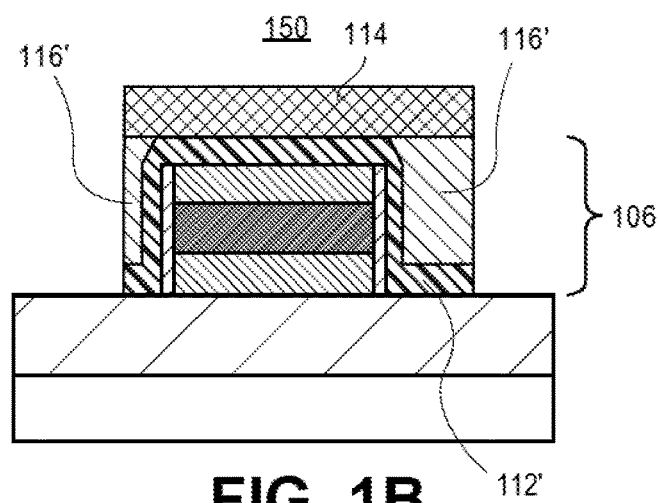

To provide an illustrative comparison, FIGS. 1A and 1B illustrate cross-sectional views of various operations in a method of fabricating a vertical thin film integrated circuit structure.

Referring to FIG. 1A, a starting structure 100 includes a first source or drain contact 104 above a substrate 102. A gate stack pedestal 106 is on the first source or drain contact 104. The gate stack pedestal 106 includes a first gate dielectric layer 108A, a gate electrode layer 110 on the first gate dielectric layer 108A. A second gate dielectric layer 108C is on the gate electrode layer 110. Gate dielectric sidewalls 108B are along the first gate dielectric layer 108A, the gate electrode layer 110 and the second gate dielectric layer 108C. A channel material 112 is over and along sidewalls of the gate stack pedestal 106. The channel material 112 is further on a portion of the first source or drain contact 104. The gate length (Lg) of channel material 112 is shown along the arrow, and is essentially equivalent to the vertical height of gate stack pedestal 106. An inter-layer dielectric (ILD) layer 116 is laterally adjacent to and exposes a top surface of the channel material 212. A second source or drain contact 114 is over the ILD layer 116 and over the exposed portion of the channel material 112 over the gate stack pedestal 106. In a particular scenario, second source or drain contact 114 is horizontally or laterally misaligned with the gate stack pedestal 106, as is depicted in FIG. 1A.

Referring to FIG. 1B, an integrated circuit structure 150 is formed by patterning ILD 116 to form 116', and patterning channel material 112 to form channel material layer 112'. However, in the case that second source or drain contact 114 is horizontally or laterally misaligned with the gate stack pedestal 106, the resulting channel material layer 112' is asymmetrically patterned, as is depicted in FIG. 1B. Such asymmetric patterning of channel material layer 112' may have negative performance impact for integrated circuit structure 150.

Figure 2:
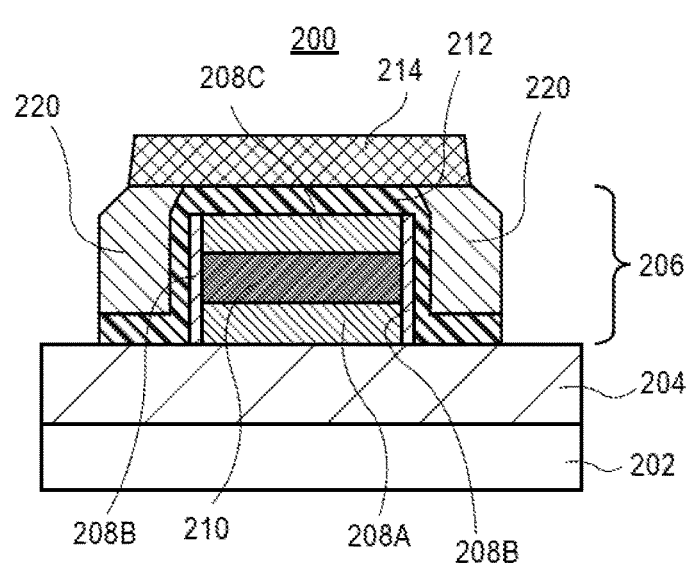
FIG. 2 illustrates a cross-sectional view of a vertical thin film transistor having self-aligned contacts, in accordance with an embodiment of the present disclosure.

By contrast to FIGS. 1A and 1B, FIG. 2 illustrates a cross-sectional view of a vertical thin film transistor having self-aligned contacts, in accordance with an embodiment of the present disclosure.

Referring to FIG. 2, an integrated circuit structure 200 includes a first source or drain contact 204 above a substrate 202. Although shown as a line source or drain contact, source or drain contact 204 could instead be a pedestal. A gate stack pedestal 206 is on the first source or drain contact 204. The gate stack pedestal 206 includes a first gate dielectric layer 208A, a gate electrode layer 210 on the first gate dielectric layer 208A. A second gate dielectric layer 208C is on the gate electrode layer 210. Gate dielectric sidewalls 208B are along the first gate dielectric layer 208A, the gate electrode layer 210 and the second gate dielectric layer 208C. A channel material layer 212 is over and along sidewalls of the gate stack pedestal 206. The channel material layer 212 is further on a portion of the first source or drain contact 204. Dielectric spacers 220 are adjacent portions of the channel material layer 212 along the sidewalls of the gate stack pedestal 206, and over a portion of the channel material layer 212 on the first source or drain contact 204. A second source or drain contact 214 is over a portion of the channel material layer 212 over the gate stack pedestal 206.

In an embodiment, dielectric spacers 220 are formed from a material such as silicon nitride, silicon oxide, silicon carbide, silicon nitride doped with carbon, or silicon oxynitride. Processes for forming sidewall spacers are well known in the art and generally include deposition and etching process operations. In some embodiments, a plurality of spacer pairs may be used. For example, two pairs, three pairs, or four pairs of sidewall spacers may be formed on opposing sides of the gate electrode. In a particular embodiment, the dielectric spacers 220 are composed of silicon nitride or silicon oxynitride.

In an embodiment, channel material layer 212 is composed of a semiconducting oxide material. In another embodiment, channel material layer 212 is composed of polycrystalline silicon. In an embodiment, the gate length (Lg) of channel material layer 212 is essentially equivalent to the vertical height of gate stack pedestal 206.

In an embodiment, the gate dielectric sidewalls 208B have a thickness less than a thickness of the first gate dielectric layer 208A, and less than a thickness of the second gate dielectric layer 208C. In one embodiment, the first gate dielectric layer 208A, the second gate dielectric layer 208C and the gate dielectric sidewalls 208B are composed of a same material. In another embodiment, the first gate dielectric layer 208A and the gate dielectric sidewalls 208B are composed of a different material. In a particular such embodiment, the second gate dielectric layer 208C is composed of a different material than the first gate dielectric layer 208A and the gate dielectric sidewalls 208B.

In an embodiment, the second source or drain contact 214 is on at least a portion of the dielectric spacers 220, as is depicted. It is to be appreciated that, although not shown, interconnect lines may be fabricated above the second source or drain contact 214. One such interconnect line may be electrically coupled to the first source or drain contact 204 or the second source or drain contact 214. It is to be appreciated that a gate contact may be fabricated by removing a portion of the channel material layer 212 and the second gate dielectric layer 208C in a region of the integrated circuit structure 200 not depicted in FIG. 2 (e.g., at a location into the page of the view depicted in FIG. 2, such as at an edge of an array).

In another aspect, to provide context, most state of the art thin film transistors are single gate. This has a consequence that as area scales, gate length scales and it becomes more difficult to turn off the transistor channel. In an embodiment, using a vertical gate device increases the gate length in the same footprint allowing a cell area to continue to scale, but with a dimension where a gate length can remain long and thus result in better channel control. In an exemplary embodiment, a feature is etched into a bottom metal line on which a back end thin film transistor is formed and gated. The trench increases the gate length of the device in the same top down area to enable better gate control without resorting to aggressive gate oxide thinning or resorting to double and triple gates or gate-all-around devices. To provide an illustrative comparison for the above concepts concerning vertical TFTs in general, FIGS. 3A and 3B illustrate cross-sectional views of planar and vertical thin film integrated circuit structures, respectively, in accordance with an embodiment of the present disclosure.

Figure 3A:
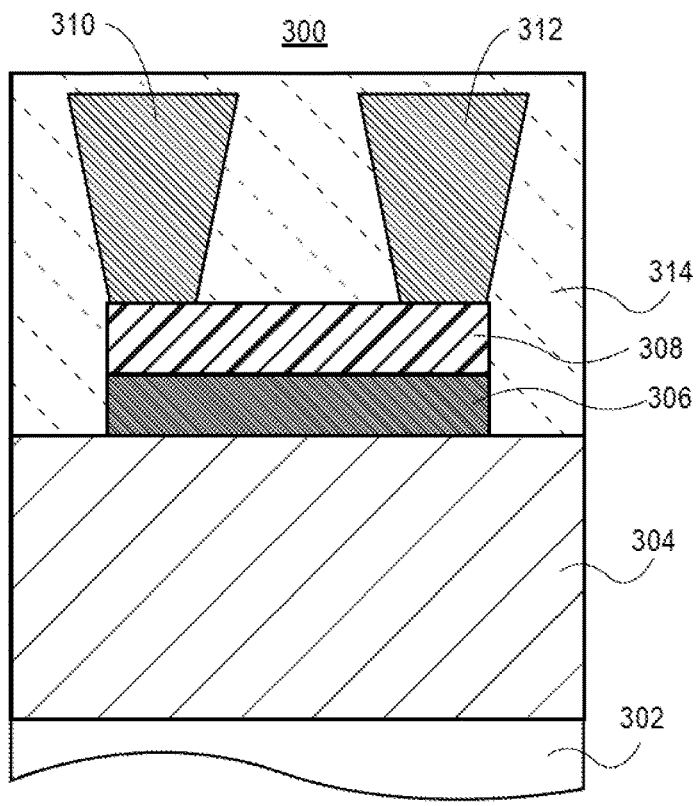
FIGS. 3A and 3B illustrate cross-sectional views of planar and vertical thin film integrated circuit structures, respectively, in accordance with an embodiment of the present disclosure.

Referring to FIG. 3A, an integrated circuit structure 300 includes a gate electrode 304 above a substrate 302. A channel material layer 308 is over the gate electrode 304. A first source or drain contact 310 is coupled to the channel material layer 308 at a first end of the channel material layer 308. A second source or drain contact 312 is coupled to the channel material layer 308 at a second end of the channel material layer 308. A dielectric layer 314 is on the channel material layer 308. A gate dielectric layer 306 is between the gate electrode 304 and the channel material layer 308.

Figure 3B:
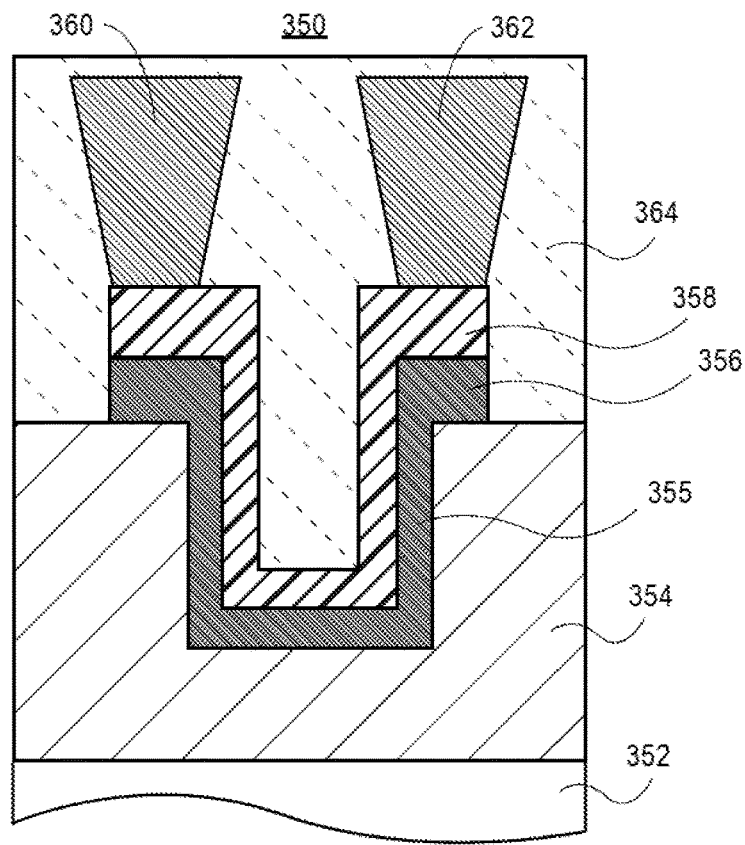

By contrast to FIG. 3A, referring to FIG. 3B, an integrated circuit structure 350 includes a gate electrode 354 above a substrate 352. The gate electrode 354 has a trench therein. A channel material layer 358 is over the gate electrode 354 and in the trench. The channel material layer 358 is conformal with the trench. A first source or drain contact 360 is coupled to the channel material layer 358 at a first end of the channel material layer 358 outside of the trench. A second source or drain contact 362 is coupled to the channel material layer 358 at a second end of the channel material layer 358 outside of the trench. In an embodiment, the integrated circuit structure 350 further includes a dielectric layer 364 on the channel material layer 358 and in the trench, as is depicted in FIG. 3B. In an embodiment, the integrated circuit structure 350 further includes a gate dielectric layer 356 between the gate electrode 352 and the channel material layer 358.

In another aspect, a fabrication method includes spacer fabrication such as fabrication of dielectric spacers 220 of FIG. 2. As an example, FIGS. 4A-4H illustrate cross-sectional views of various operations in a method of fabricating a thin film integrated circuit structure of the type of FIG. 2, in accordance with an embodiment of the present disclosure.

Figure 4A:
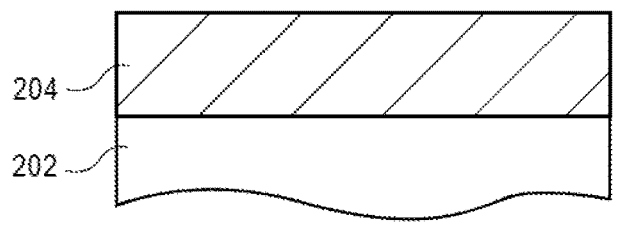
FIGS. 4A-4H illustrate cross-sectional views of various operations in a method of fabricating a thin film integrated circuit structure of the type of FIG. 2, in accordance with an embodiment of the present disclosure.

Referring to FIG. 4A, a method of fabricating an integrated circuit structure includes forming a first source or drain contact 204 above a substrate 202.

Figure 4B:
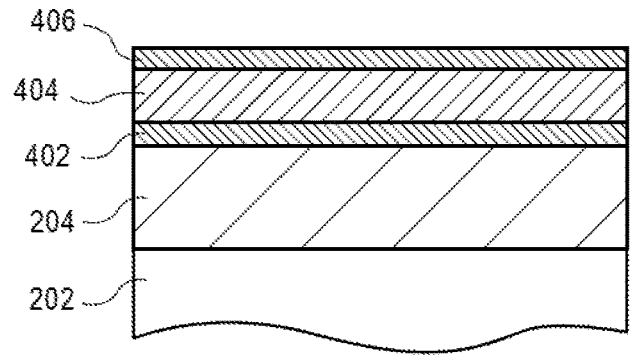

Referring to FIG. 4B, a gate stack is formed on the first source or drain contact 204. The gate stack includes a first gate dielectric material 402, a gate electrode material 404 on the first gate dielectric material 402, a second gate dielectric material 406 on the gate electrode material 404.

Figure 4C:
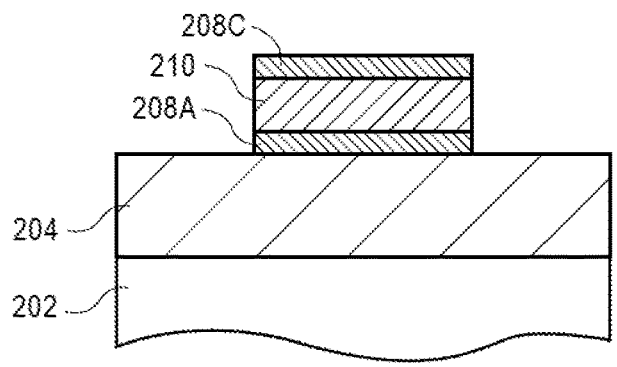

Referring to FIG. 4C, the first gate dielectric material 402, the gate electrode material 404, and the second gate dielectric material 406 are patterned to form a gate stack pedestal on the first source or drain contact 204. The gate stack pedestal includes a first gate dielectric layer 208A, a gate electrode layer 210 on the first gate dielectric layer 208A, and a second gate dielectric layer 208C on the gate electrode layer 210.

Figure 4D:
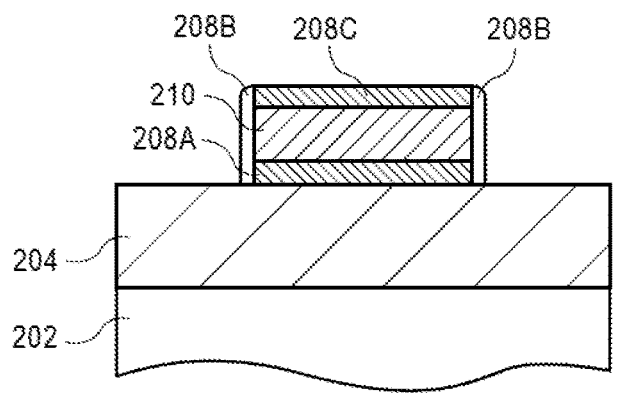

Referring to FIG. 4D, gate dielectric sidewalls 208B are formed along the first gate dielectric layer 208A, the gate electrode layer 210 and the second gate dielectric layer 208B. Processes for forming sidewall spacers are well known in the art and generally include deposition and etching process operations.

Figure 4E:
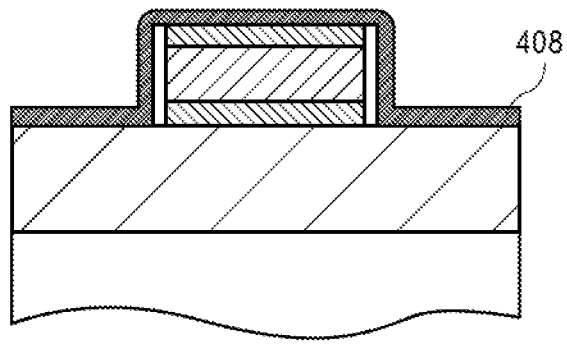

Referring to FIG. 4E, a channel material 408 is formed over and along sidewalls of the gate stack pedestal of FIG. 4D, and further on the first source or drain contact 204.

Figure 4F:
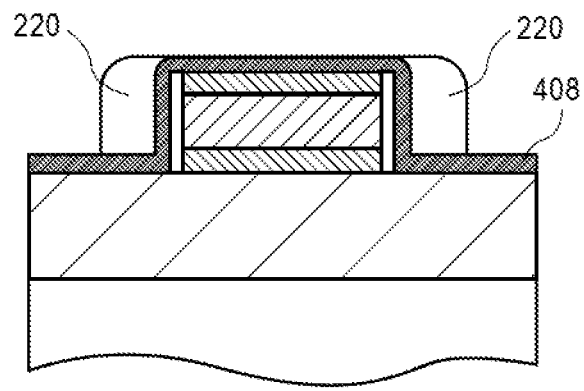

Referring to FIG. 4F, dielectric spacers 220 are formed adjacent portions of the channel material 408 along the sidewalls of the gate stack pedestal and on a portion of the channel material 408 on the first source or drain contact 204. Processes for forming sidewall spacers are well known in the art and generally include deposition and etching process operations.

Figure 4G:
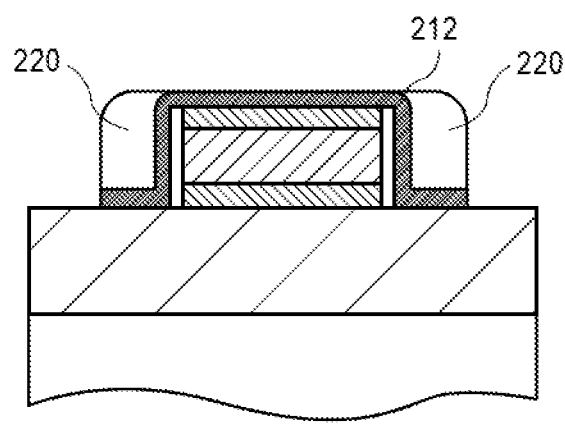

Referring to FIG. 4G, channel material 408 is patterned on the first source or drain contact 204 to form a channel material layer 212 using the dielectric spacers 220 as a mask.

Figure 4H:
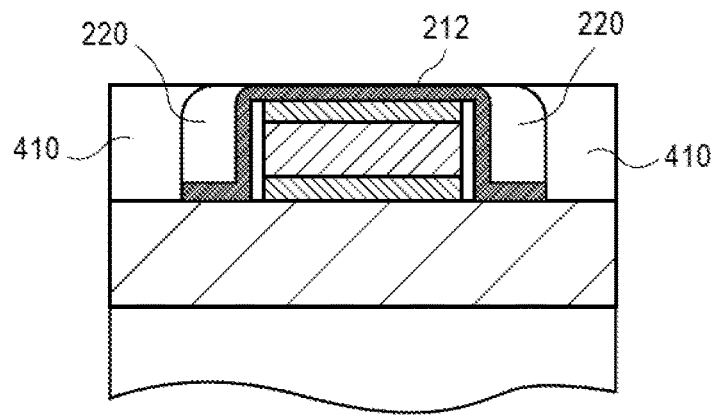

Referring to FIG. 4H, an inter-layer dielectric (ILD) layer 410 is formed over the structure of FIG. 4G and planarized to expose a portion of the channel material 212. In an embodiment, a second source or drain contact is then formed over a portion of the channel material layer 212 over the gate stack pedestal, such as second source or drain contact 214 described in association with FIG. 2. In one such embodiment, the second source or drain contact 214 is formed by etching a conductive layer, wherein the dielectric spacers 220 are an etch stop during the etching.

In an embodiment, referring to FIG. 2, second source or drain contact 214 is laterally aligned with gate stack pedestal 206. In other embodiments, the second source or drain contact 214 is laterally misaligned with gate stack pedestal 206. However, the dielectric spacers 220 preserve equally patterned (self-aligned) portions of the channel material layer 212 on the first source or drain contact 204. As an example, FIG. 5 illustrates a cross-sectional view of another vertical thin film transistor having self-aligned contacts, in accordance with another embodiment of the present disclosure.

Figure 5:
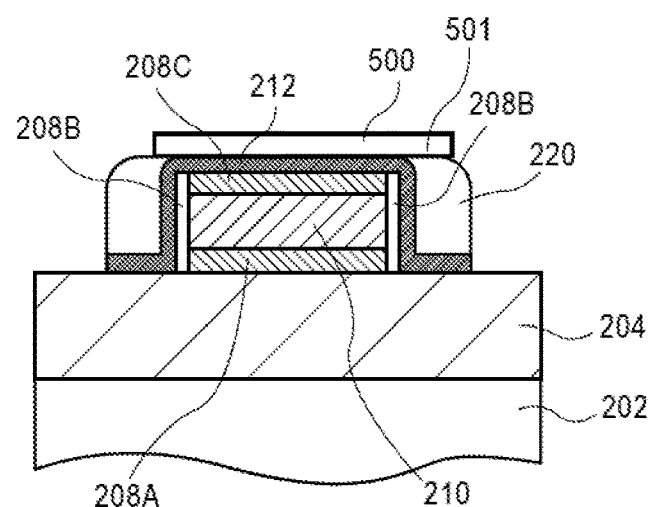
FIG. 5 illustrates a cross-sectional view of another vertical thin film transistor having self-aligned contacts, in accordance with another embodiment of the present disclosure.

Referring to FIG. 5, a second source or drain contact 500 is horizontally offset relative to the underlying gate stack pedestal. That is, portion 501 is an offset portion of second source or drain contact 500 extending substantially over the right dielectric spacer 220. However, the gate stack pedestal and the channel material layer 212 has a same structure as if the second source or drain contact 500 was patterned without misalignment (e.g., the gate stack pedestal and the channel material layer 212 of FIG. 5 have a same structure as the gate stack pedestal and the channel material layer 212 of FIG. 2). As a result, whether a second source or drain contact is laterally aligned with an underlying gate stack (e.g., second source or drain contact 214) or is laterally aligned with an underlying gate stack (e.g., second source or drain contact 500), the second source or drain contact is referred to herein as a self-aligned contact.

In another aspect, dual or multiple spacers may be used. As an example, FIG. 6 illustrates a cross-sectional view of another vertical thin film transistor having self-aligned contacts, in accordance with another embodiment of the present disclosure.

Figure 6:
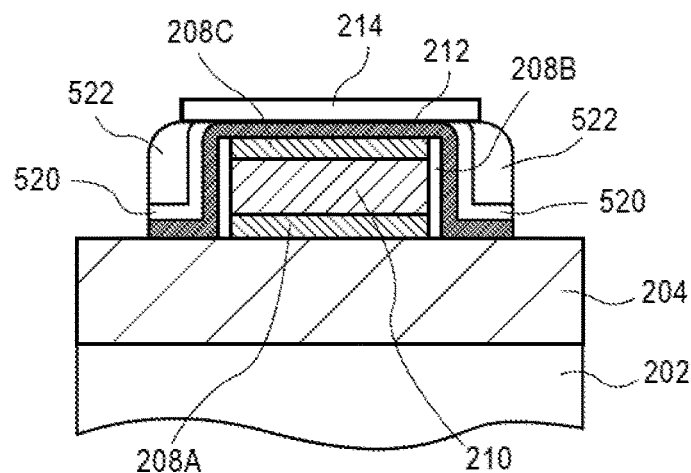
FIG. 6 illustrates a cross-sectional view of another vertical thin film transistor having self-aligned contacts, in accordance with another embodiment of the present disclosure.

Referring to FIG. 6, an integrated circuit structure includes a first source or drain contact 204 above a substrate 202. A gate stack pedestal is on the first source or drain contact 204. The gate stack pedestal includes a first gate dielectric layer 208A, a gate electrode layer 210 on the first gate dielectric layer 208A, a second gate dielectric layer 208C on the gate electrode layer 210, and gate dielectric sidewalls 208B along the first gate dielectric layer 208A, the gate electrode layer 210 and the second gate dielectric layer 208C. A channel material layer 212 is over and along sidewalls of the gate stack pedestal, and further on a portion of the first source or drain contact 204. First dielectric spacers 520 are adjacent portions of the channel material layer 212 along the sidewalls of the gate stack pedestal. In one embodiment, the first dielectric spacers 520 are passivating or sealing for the channel material layer 212. Second dielectric spacers 522 are adjacent the first dielectric spacers 520. In one embodiment, the second dielectric spacers 522 have a higher etch resistance than the first dielectric spacers 520. A second source or drain contact 214 is over a portion of the channel material layer 212 over the gate stack pedestal. In one embodiment, the first dielectric spacers 520 include one or more of $TiO_2$, $HfO_2$, HZO, $ZrO_2$, HfSiOx, HfAlOx, $Al_2O_3$, $HfO_2$, YZO, $Y_2O_3$, TaSiOx, AlSiOx, $La_2O_3$, HfLaOx, $SiO_2$, AlN, or AlSiOx.

In an embodiment, the first dielectric spacers 520 include a dopant species, such as phosphorous or boron dopant atoms in the case of a polycrystalline channel material. In an embodiment, the second source or drain contact 214 is on at least a portion of the first 520 and second 522 dielectric spacers, as is depicted. In an embodiment, the second source or drain contact 214 is horizontally or laterally aligned with the gate stack pedestal, as is depicted in FIG. 6. In another embodiment, the second source or drain contact 214 is horizontally or laterally offset relative to the gate stack pedestal. In an embodiment, the second 522 dielectric spacers are preserved in a final integrated circuit structure. In another embodiment, at least a portion of, and possibly all of, the second 522 dielectric spacers are removed.

In another embodiment, vertical thin film transistors described above can provide a compact architecture with cell layout area of 4F2 (e.g., for eDRAM applications), whereas a planar structure is limited to 6F2. In an embodiment, a vertical TFT is fabricated to provide a footprint with the potential for scaling down to 4F2 for memory applications. In one embodiment, vertical architectures described herein provide for self-aligned isolation of an active area, which prevents shorting between neighboring transistors. Such an asymmetric structure can allow for independent tuning of overlap capacitance.

Advantages of implementing one or more embodiments described herein may include one or more of (1) enabling the fabrication of 1T-1C architectures with a minimum possible 4F2 area (1.5-2×scaling), (2) passivation induced self-alignment, (3) control of Rc because of area control, (4) spacer passivation can additionally dope/counter-dope a channel material, (5) spacer formation for hermetic sealing, (6) gate length (Lg) decoupling from a patterning process, (7) enabling capacitor scaling, and/or (8) enabling independent treatment of first or second source or drain contacts.

It is to be appreciated that the layers and materials described in association with embodiments herein are typically formed on or above an underlying semiconductor substrate 202, e.g., as FEOL layer(s). In other embodiments, the layers and materials described in association with embodiments herein are typically formed on or above underlying device layer(s) of an integrated circuit, e.g., as BEOL layer(s) above an underlying semiconductor substrate 202. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer is included between a plurality of vertical thin film transistors and an underlying substrate, the insulator layer may be composed of a material suitable to ultimately electrically isolate, or contribute to the isolation of, thin film transistors from an underlying bulk substrate or interconnect layer. For example, in one embodiment, such an insulator layer is composed of a dielectric material such as, but not limited to, silicon dioxide, silicon oxy-nitride, silicon nitride, or carbon-doped silicon nitride. In a particular embodiment, such an insulator layer is a low-k dielectric layer of an underlying BEOL layer.

In an embodiment, the channel material layer 208 of a TFT includes an IGZO layer that has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO. In another embodiment, the channel material layer 208 or 558 is or includes a material such as tin oxide, antimony oxide, indium oxide, indium tin oxide, titanium oxide, zinc oxide, indium zinc oxide, gallium oxide, titanium oxynitride, ruthenium oxide, or tungsten oxide. In another embodiment, polycrystalline silicon is used as the channel material instead of a semiconducting oxide material. In an embodiment, no matter the composition, the channel material layer 208 has a thickness between 5 nanometers and 30 nanometers. In another embodiment, the channel material layer 208 of a TFT includes an oxide semiconductor such as, but not limited to, SnO, $SnO_2$, $Cu_2O$, CoO, ZnO, $Ga_2O_3$, IZO, ITO, AZO, or $TiO_2$. In another embodiment, the channel material layer 208 includes a material such as, but not limited to, poly-Si, poly-SiGe, poly-Ge, poly-III-V, BeTe, or other tellurides. In another embodiment, the channel material layer 208 includes a material such as, but not limited to, MoS2, MoSe2, WSe2, WS2, tungsten oxide, black phosphorus, SnO, Cu2O, CuSnO, NiO, NbO, ITZO, IZO, AZO, AZTO, Ga2O3, IGO, ITO, and bi- or multilayers thereof.

In an embodiment, the channel material layer 208 is an amorphous, crystalline, or semi crystalline oxide semiconductor, such as an amorphous, crystalline, or semi crystalline oxide semiconducting IGZO layer. The semiconducting oxide material may be formed using a low-temperature deposition process, such as physical vapor deposition (PVD) (e.g., sputtering), atomic layer deposition (ALD), or chemical vapor deposition (CVD). The ability to deposit the semiconducting oxide material at temperatures low enough to be compatible with back-end manufacturing processes represents a particular advantage. The semiconducting oxide material may be deposited on sidewalls or conformably on any desired structure to a precise thickness, allowing the manufacture of transistors having any desired geometry.

In an embodiment, gate electrodes 210 described herein include at least one P-type work function metal or N-type work function metal, depending on whether the integrated circuit device 200 (or the device of FIG. 5 or 6) is to be included in a P-type transistor or an N-type transistor. For a P-type transistors, metals that may be used for the gate electrode may include, but are not limited to, ruthenium, palladium, platinum, cobalt, nickel, and conductive metal oxides (e.g., ruthenium oxide). For an N-type transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer.

In an embodiment, gate dielectric layers described herein are composed of or include a high-K material. For example, in one embodiment, a gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In an embodiment, gate dielectric layers described herein are composed of or include HfO2, HZO, ZrO2, HfSiOx, HfAlOx, Al2O3, HfO2, YZO, Y2O3, TaSiOx, AlSiOx, or La2O3, HfLaOx.

In some embodiments, the channel material 212 is in contact with a gate dielectric layer, an arrangement which may put an IGZO layer in contact with a high-k metal oxide layer. In other embodiments, an intermediate material is disposed between the channel material 212 and one or more of the gate dielectric layer 208A, 208B or 208C, respectively. In some embodiments, an IGZO layer includes multiple regions of IGZO having different material properties. For example, an IGZO layer may include low indium content IGZO close to (e.g., in contact with) a high-k gate dielectric layer, and a high indium content IGZO close to (e.g., in contact with) the higher mobility semiconducting oxide channel material. High indium content IGZO may provide higher mobility and poorer interface properties relative to low indium content IGZO, while low indium content IGZO may provide a wider band gap, lower gate leakage, and better interface properties, although a lower mobility, relative to high indium content IGZO.

In an embodiment, conductive contacts, such as conductive contacts 204, 214 and 500, act as contacts to source or drain regions of a TFT, or act directly as source or drain regions of the TFT. The conductive contacts may be spaced apart by a distance that is the gate length of the transistor integrated circuit device 200, or the device of FIG. 5 or FIG. 6. In some embodiments, the gate length is between 7 and 30 nanometers. In an embodiment, the conductive contacts include one or more layers of metal and/or metal alloys. In a particular embodiment, the conductive contacts are composed of copper or a copper-containing alloy, or aluminum or an aluminum-containing alloy.

In an embodiment, interconnect lines (and, possibly, underlying via structures), such as interconnect lines, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, lithographic operations are performed using 193 nm immersion lithography (i193), extreme ultraviolet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that not all aspects of the processes described above need be practiced to fall within the spirit and scope of embodiments of the present disclosure. Also, the processes described herein may be used to fabricate one or a plurality of semiconductor devices. One or more embodiments may be particularly useful for fabricating semiconductor devices at a 10 nanometer (10 nm) or smaller technology node.

In another aspect, the performance of a thin film transistor (TFT) may depend on the carrier mobility of the components in the TFT. For example, a material with a higher carrier mobility enables carriers to move more quickly in response to a given electric field than a material with a lower carrier mobility. Accordingly, high carrier mobilities may be associated with improved performance. Although shown and described above as single semiconducting oxide layers, in accordance with embodiments described herein, a layer of a semiconducting oxide, such as a layer of IGZO, is between a high-k gate dielectric material and a higher mobility semiconducting oxide channel material. Although IGZO has a relatively low mobility (approximately 10 $cm^2/V \cdot s$), the sub threshold swing of IGZO may be close to the conventional theoretical lower limit. In some embodiments, a thin layer of IGZO may directly border a channel material of choice, and may be sandwiched between the channel material and the high-k dielectric. The use of IGZO at the interface between the gate stack and the channel may achieve one or more of a number of advantages. For example, an IGZO interface may have a relatively small number of interface traps, defects at which carriers are trapped and released that impede performance. A TFT that includes an IGZO layer as a second semiconducting oxide material may exhibit desirably low gate leakage. When IGZO is used as an interface to a non-IGZO semiconducting oxide channel material (e.g., a thin film oxide semiconductor material having a higher mobility than IGZO), the benefits of the higher mobility channel material may be realized simultaneously with the good gate oxide interface properties provided by the IGZO. In accordance with one or more embodiments described herein, a gate-channel arrangement based on a dual semiconducting oxide layer channel enables the use of a wider array of thin film transistor channel materials, while achieving desirable gate control, than realizable using conventional approaches.

In an embodiment, the addition of a second thin film semiconductor around a first TFT material can provide one or more of mobility enhancement, improved short channel effects (SCEs) particularly if all conduction occurs in the second material. The second TFT material may be selected for strong oxygen bond capability in order to stabilize the TFT when exposed to downstream processing. In accordance with one embodiment, a higher mobility semiconducting oxide material is effectively wrapped in a lower mobility material semiconducting oxide that is more oxygen stable. The resulting structure may limit the negative effects of downstream high temperature processing operations or aggressive operations on the inner TFT material by having the highly stable outer material. An increased set of materials that can be chosen to maximize stability and mobility simultaneously may be achieved using such a dual material architecture.

In another aspect, the integrated circuit structures described herein may be included in an electronic device. As a first example of an apparatus that may include one or more of the TFTs disclosed herein, FIGS. 7A and 7B are top views of a wafer and dies that include one or more vertical thin film transistors having self-aligned contacts, in accordance with any of the embodiments disclosed herein.

Figure 7B:
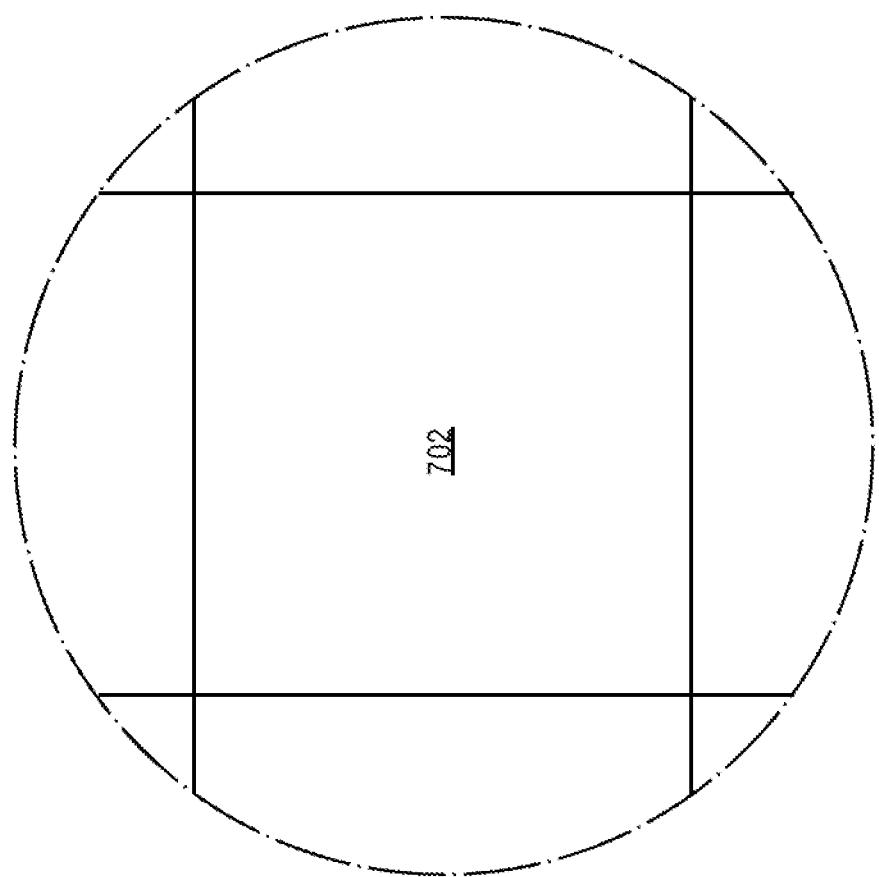
FIGS. 7A and 7B are top views of a wafer and dies that include one or more vertical thin film transistors having self-aligned contacts, in accordance with one or more of the embodiments disclosed herein.
Figure 7A:
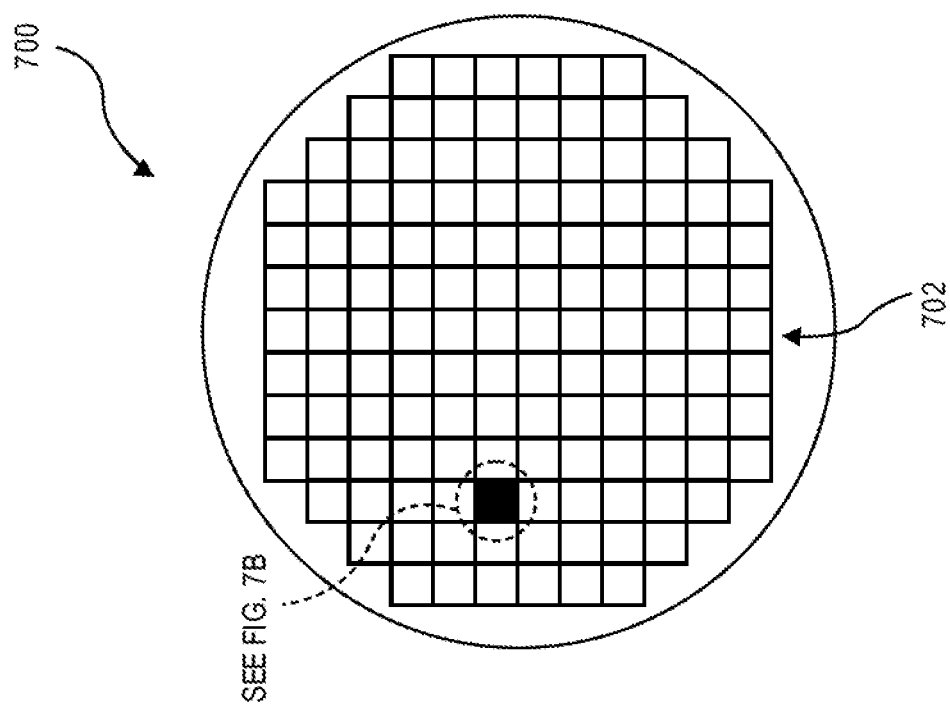

Referring to FIGS. 7A and 7B, a wafer 700 may be composed of semiconductor material and may include one or more dies 702 having integrated circuit (IC) structures formed on a surface of the wafer 700. Each of the dies 702 may be a repeating unit of a semiconductor product that includes any suitable IC (e.g., ICs including one or more structures such as structure 200, or the structure of FIG. 5 or FIG. 6). After the fabrication of the semiconductor product is complete (e.g., after manufacture of structure 200, or the structure of FIG. 5 or FIG. 6), the wafer 700 may undergo a singulation process in which each of the dies 702 is separated from one another to provide discrete "chips" of the semiconductor product. In particular, devices that include TFT as disclosed herein may take the form of the wafer 700 (e.g., not singulated) or the form of the die 702 (e.g., singulated). The die 702 may include one or more transistors and/or supporting circuitry to route electrical signals to the transistors, as well as any other IC components. In some embodiments, the wafer 700 or the die 702 may include a memory device (e.g., a static random access memory (SRAM) device), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device or other logic that is configured to store information in the memory devices or execute instructions stored in the memory array.

Figure 8:
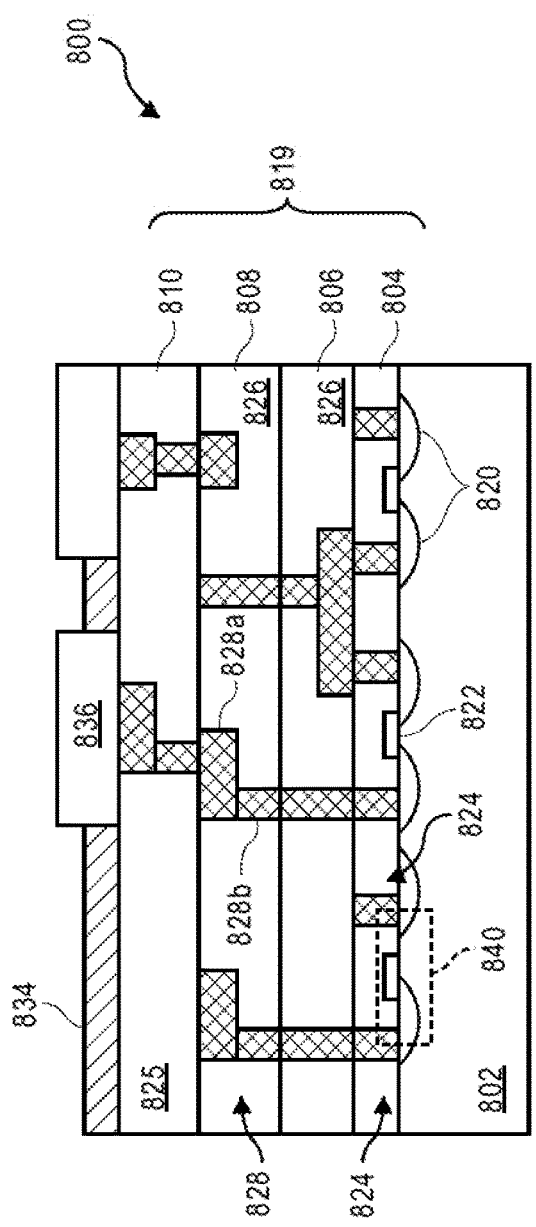
FIG. 8 is a cross-sectional side view of an integrated circuit (IC) device that may include one or more vertical thin film transistors having self-aligned contacts, in accordance with one or more of the embodiments disclosed herein.

FIG. 8 is a cross-sectional side view of an integrated circuit (IC) device that may include one or more vertical thin film transistors having self-aligned contacts, in accordance with one or more of the embodiments disclosed herein.

Referring to FIG. 8, an IC device 800 is formed on a substrate 802 (e.g., the wafer 700 of FIG. 7A) and may be included in a die (e.g., the die 702 of FIG. 7B), which may be singulated or included in a wafer. Although a few examples of materials from which the substrate 802 may be formed are described above in association with substrate 202, any material that may serve as a foundation for an IC device 800 may be used.

The IC device 800 may include one or more device layers, such as device layer 804, disposed on the substrate 802. The device layer 804 may include features of one or more transistors 840 (e.g., TFTs described above) formed on the substrate 802. The device layer 804 may include, for example, one or more source and/or drain (S/D) regions 820, a gate 822 to control current flow in the transistors 840 between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 840 take the form of the transistor 200, or the device of FIG. 5 of FIG. 6. Thin-film transistors such as 200, or the transistor of FIG. 5 or FIG. 6, may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 840 of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form an interlayer dielectric (ILD) stack 819 of the IC device 800.

The interconnect structures 828 may be arranged within the interconnect layers 806-810 to route electrical signals according to a wide variety of designs (in particular, the arrangement is not limited to the particular configuration of interconnect structures 828 depicted in FIG. 8). Although a particular number of interconnect layers 806-810 is depicted in FIG. 8, embodiments of the present disclosure include IC devices having more or fewer interconnect layers than depicted.

In some embodiments, the interconnect structures 828 may include trench structures 828a (sometimes referred to as "lines") and/or via structures 828b filled with an electrically conductive material such as a metal. The trench structures 828a may be arranged to route electrical signals in a direction of a plane that is substantially parallel with a surface of the substrate 802 upon which the device layer 804 is formed. For example, the trench structures 828a may route electrical signals in a direction in and out of the page from the perspective of FIG. 8. The via structures 828b may be arranged to route electrical signals in a direction of a plane that is substantially perpendicular to the surface of the substrate 802 upon which the device layer 804 is formed. In some embodiments, the via structures 828b may electrically couple trench structures 828a of different interconnect layers 806-810 together.

The interconnect layers 806-810 may include a dielectric material 826 disposed between the interconnect structures 828, as shown in FIG. 8. In some embodiments, the dielectric material 826 disposed between the interconnect structures 828 in different ones of the interconnect layers 806-810 may have different compositions; in other embodiments, the composition of the dielectric material 826 between different interconnect layers 806-810 may be the same. In either case, such dielectric materials may be referred to as inter-layer dielectric (ILD) materials.

A first interconnect layer 806 (referred to as Metal 1 or "M1") may be formed directly on the device layer 804. In some embodiments, the first interconnect layer 806 may include trench structures 828a and/or via structures 828b, as shown. The trench structures 828a of the first interconnect layer 806 may be coupled with contacts (e.g., the S/D contacts 824) of the device layer 804.

A second interconnect layer 808 (referred to as Metal 2 or "M2") may be formed directly on the first interconnect layer 806. In some embodiments, the second interconnect layer 808 may include via structures 828b to couple the trench structures 828a of the second interconnect layer 808 with the trench structures 828a of the first interconnect layer 806. Although the trench structures 828a and the via structures 828b are structurally delineated with a line within each interconnect layer (e.g., within the second interconnect layer 808) for the sake of clarity, the trench structures 828a and the via structures 828b may be structurally and/or materially contiguous (e.g., simultaneously filled during a dual-damascene process) in some embodiments.

A third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806.

The IC device 800 may include a solder resist material 834 (e.g., polyimide or similar material) and one or more bond pads 836 formed on the interconnect layers 806-810. The bond pads 836 may be electrically coupled with the interconnect structures 828 and configured to route the electrical signals of the transistor(s) 840 to other external devices. For example, solder bonds may be formed on the one or more bond pads 836 to mechanically and/or electrically couple a chip including the IC device 800 with another component (e.g., a circuit board). The IC device 800 may have other alternative configurations to route the electrical signals from the interconnect layers 806-810 than depicted in other embodiments. For example, the bond pads 836 may be replaced by or may further include other analogous features (e.g., posts) that route the electrical signals to external components.

Figure 9:
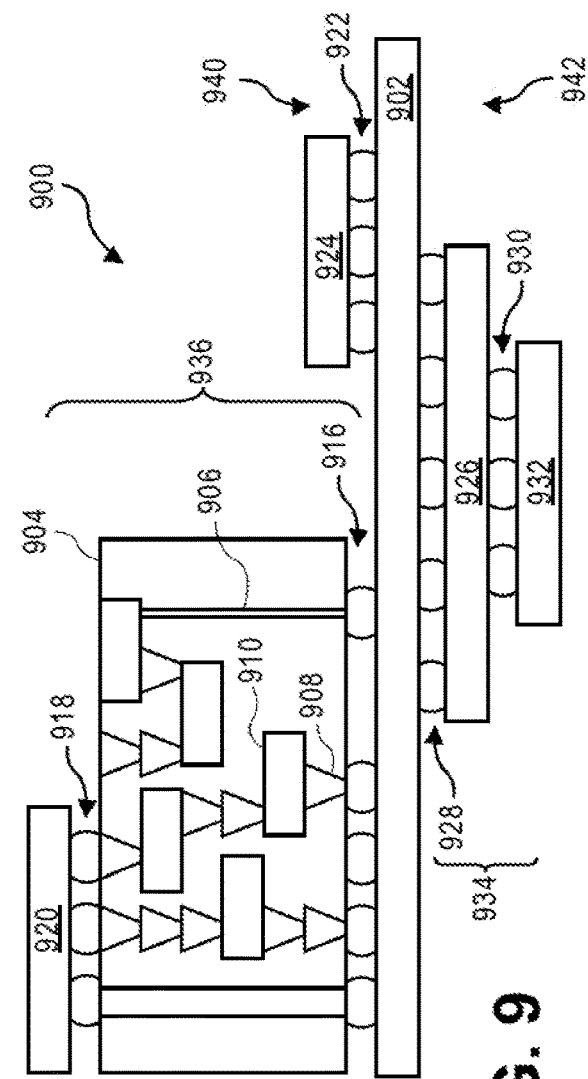
FIG. 9 is a cross-sectional side view of an integrated circuit (IC) device assembly that may include one or more vertical thin film transistors having self-aligned contacts, in accordance with one or more of the embodiments disclosed herein.

FIG. 9 is a cross-sectional side view of an integrated circuit (IC) device assembly that may include one or more vertical thin film transistors having self-aligned contacts, in accordance with one or more of the embodiments disclosed herein.

Referring to FIG. 9, an IC device assembly 900 includes components having one or more integrated circuit structures described herein. The IC device assembly 900 includes a number of components disposed on a circuit board 902 (which may be, e.g., a motherboard). The IC device assembly 900 includes components disposed on a first face 940 of the circuit board 902 and an opposing second face 942 of the circuit board 902. Generally, components may be disposed on one or both faces 940 and 942. In particular, any suitable ones of the components of the IC device assembly 900 may include a number of the TFT structures 200, or a structure of FIG. 5 or FIG. 6, disclosed herein.

In some embodiments, the circuit board 902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate.

The IC device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), male and female portions of a socket, an adhesive, an underfill material, and/or any other suitable electrical and/or mechanical coupling structure.

The package-on-interposer structure 936 may include an IC package 920 coupled to an interposer 904 by coupling components 918. The coupling components 918 may take any suitable form for the application, such as the forms discussed above with reference to the coupling components 916. Although a single IC package 920 is shown in FIG. 9, multiple IC packages may be coupled to the interposer 904. It is to be appreciated that additional interposers may be coupled to the interposer 904. The interposer 904 may provide an intervening substrate used to bridge the circuit board 902 and the IC package 920. The IC package 920 may be or include, for example, a die (the die 702 of FIG. 7B), an IC device (e.g., the IC device 800 of FIG. 8), or any other suitable component. Generally, the interposer 904 may spread a connection to a wider pitch or reroute a connection to a different connection. For example, the interposer 904 may couple the IC package 920 (e.g., a die) to a ball grid array (BGA) of the coupling components 916 for coupling to the circuit board 902. In the embodiment illustrated in FIG. 9, the IC package 920 and the circuit board 902 are attached to opposing sides of the interposer 904. In other embodiments, the IC package 920 and the circuit board 902 may be attached to a same side of the interposer 904. In some embodiments, three or more components may be interconnected by way of the interposer 904.

The interposer 904 may be formed of an epoxy resin, a fiberglass-reinforced epoxy resin, a ceramic material, or a polymer material such as polyimide. In some implementations, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through-silicon vias (TSVs) 906. The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The IC device assembly 900 may include an IC package 924 coupled to the first face 940 of the circuit board 902 by coupling components 922. The coupling components 922 may take the form of any of the embodiments discussed above with reference to the coupling components 916, and the IC package 924 may take the form of any of the embodiments discussed above with reference to the IC package 920.

The IC device assembly 900 illustrated in FIG. 9 includes a package-on-package structure 934 coupled to the second face 942 of the circuit board 902 by coupling components 928. The package-on-package structure 934 may include an IC package 926 and an IC package 932 coupled together by coupling components 930 such that the IC package 926 is disposed between the circuit board 902 and the IC package 932. The coupling components 928 and 930 may take the form of any of the embodiments of the coupling components 916 discussed above, and the IC packages 926 and 932 may take the form of any of the embodiments of the IC package 920 discussed above. The package-on-package structure 934 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
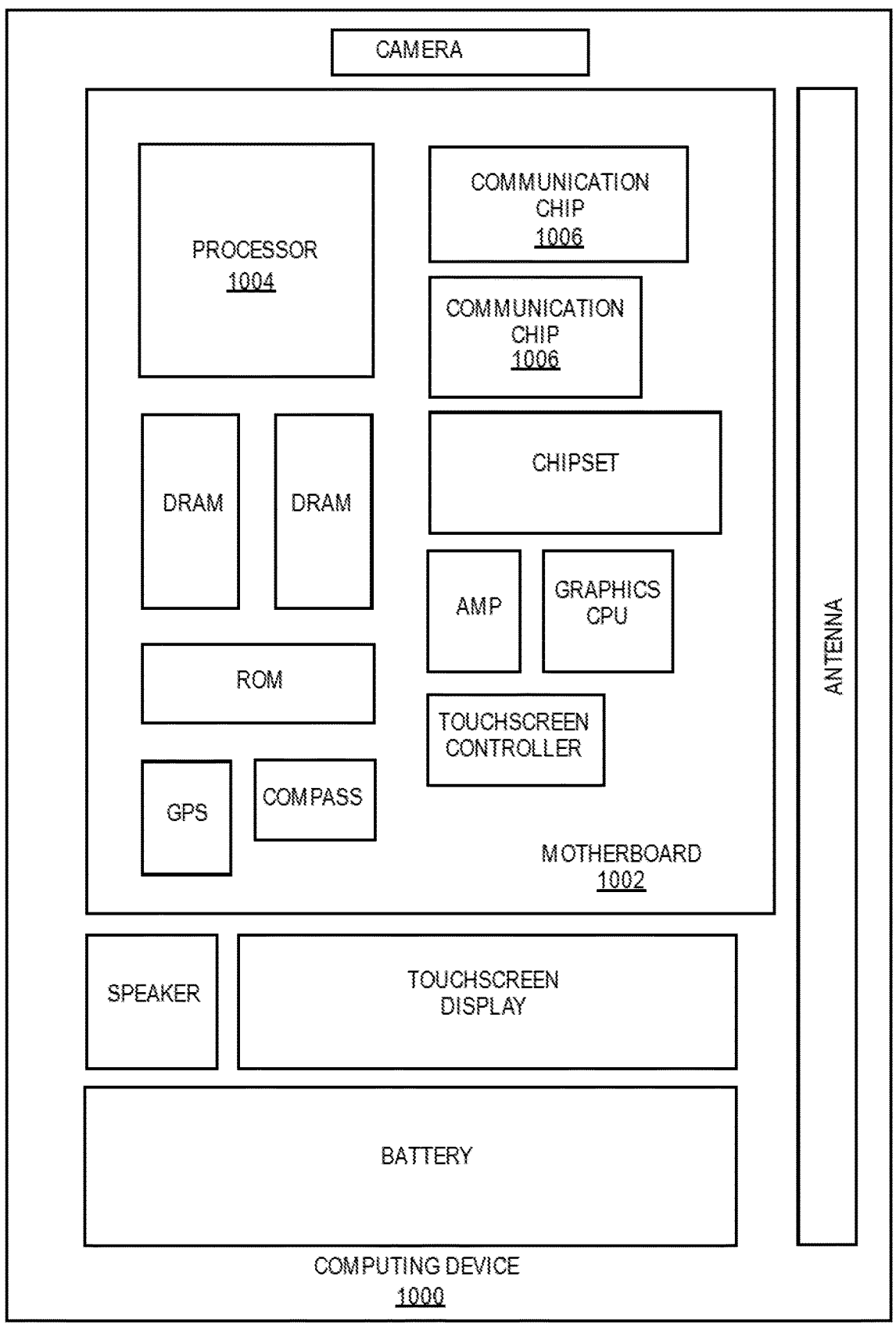
FIG. 10 illustrates a computing device in accordance with one implementation of an embodiment of the disclosure.

FIG. 10 illustrates a computing device 1000 in accordance with one implementation of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the disclosure, the integrated circuit die of the processor includes one or more vertical thin film transistors having self-aligned contacts, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the disclosure, the integrated circuit die of the communication chip includes one or more vertical thin film transistors having self-aligned contacts, in accordance with implementations of embodiments of the disclosure.

In further implementations, another component housed within the computing device 1000 may contain an integrated circuit die that includes one or more vertical thin film transistors having self-aligned contacts, in accordance with implementations of embodiments of the disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments described herein include vertical thin film transistors having self-aligned contacts.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first source or drain contact above a substrate. A gate stack pedestal is on the first source or drain contact, the gate stack pedestal including a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer. A channel material layer is over and along sidewalls of the gate stack pedestal, the channel material layer further on a portion of the first source or drain contact. Dielectric spacers are adjacent portions of the channel material layer along the sidewalls of the gate stack pedestal. A second source or drain contact is over a portion of the channel material layer over the gate stack pedestal.

Example embodiment 2: The integrated circuit structure of example embodiment 1, wherein the dielectric spacers include silicon nitride or silicon oxynitride.

Example embodiment 3: The integrated circuit structure of example embodiment 1 or 2, wherein channel material layer includes a semiconducting oxide material.

Example embodiment 4: The integrated circuit structure of example embodiment 1 or 2, wherein channel material layer includes polycrystalline silicon.

Example embodiment 5: The integrated circuit structure of example embodiment 1, 2, 3 or 4, wherein the gate dielectric sidewalls have a thickness less than a thickness of the first gate dielectric layer, and less than a thickness of the second gate dielectric layer.

Example embodiment 6: The integrated circuit structure of example embodiment 1, 2, 3, 4 or 5, wherein the first gate dielectric layer, the second gate dielectric layer and the gate dielectric sidewalls are composed of a same material.

Example embodiment 7: The integrated circuit structure of example embodiment 1, 2, 3, 4 or 5, wherein the first gate dielectric layer and the gate dielectric sidewalls are composed of a different material.

Example embodiment 8: The integrated circuit structure of example embodiment 1, 2, 3, 4, 5 or 7, wherein the second gate dielectric layer is composed of a different material than the first gate dielectric layer and the gate dielectric sidewalls.

Example embodiment 9: The integrated circuit structure of example embodiment 1, 2, 3, 4, 5, 6, 7 or 8, wherein the second source or drain contact is on at least a portion of the dielectric spacers.

Example embodiment 10: The integrated circuit structure of example embodiment 1, 2, 3, 4, 5, 6, 7, 8 or 9, wherein the second source or drain contact is horizontally offset relative to the gate stack pedestal.

Example embodiment 11: A method of fabricating an integrated circuit structure includes forming a first source or drain contact above a substrate. A gate stack pedestal is formed on the first source or drain contact, the gate stack pedestal including a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer. A channel material is formed over and along sidewalls of the gate stack pedestal, the channel material further on the first source or drain contact. Dielectric spacers are formed adjacent portions of the channel material along the sidewalls of the gate stack pedestal and on a portion of the channel material on the first source or drain contact. The channel material is patterned on the first source or drain contact to form a channel material layer using the dielectric spacers as a mask. A second source or drain contact is formed over a portion of the channel material layer over the gate stack pedestal by etching a conductive layer, wherein the dielectric spacers are an etch stop during the etching.

Example embodiment 12: The integrated circuit structure of example embodiment 11, wherein the dielectric spacers include silicon nitride or silicon oxynitride.

Example embodiment 13: The integrated circuit structure of example embodiment 11 or 12, wherein channel material layer includes a semiconducting oxide material.

Example embodiment 14: The integrated circuit structure of example embodiment 11 or 12, wherein channel material layer includes polycrystalline silicon.

Example embodiment 15: An integrated circuit structure includes a first source or drain contact above a substrate. A gate stack pedestal is on the first source or drain contact, the gate stack pedestal including a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer. A channel material layer is over and along sidewalls of the gate stack pedestal, the channel material layer further on a portion of the first source or drain contact. First dielectric spacers are adjacent portions of the channel material layer along the sidewalls of the gate stack pedestal. The first dielectric spacers are passivating for the channel material layer. Second dielectric spacers are adjacent the first dielectric spacers. The second dielectric spacers have a higher etch resistance than the first dielectric spacers. A second source or drain contact over a portion of the channel material layer over the gate stack pedestal.

Example embodiment 16: The integrated circuit structure of example embodiment 15, wherein the first dielectric spacers include a dopant species.

Example embodiment 17: The integrated circuit structure of example embodiment 15 or 16, wherein channel material layer includes a semiconducting oxide material.

Example embodiment 18: The integrated circuit structure of example embodiment 15 or 16, wherein channel material layer includes polycrystalline silicon.

Example embodiment 19: The integrated circuit structure of example embodiment 15, 16, 17 or 18, wherein the second source or drain contact is on at least a portion of the first and second dielectric spacers.

Example embodiment 20: The integrated circuit structure of example embodiment 15, 16, 17, 18 or 19, wherein the second source or drain contact is horizontally offset relative to the gate stack pedestal.

What is claimed is:

1. An integrated circuit structure, comprising:
   a first source or drain contact above a substrate;
   a gate stack pedestal on the first source or drain contact, the gate stack pedestal comprising a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer;
   a channel material layer over and along sidewalls of the gate stack pedestal, the channel material layer further on a portion of the first source or drain contact;
   dielectric spacers adjacent portions of the channel material layer along the sidewalls of the gate stack pedestal; and
   a second source or drain contact over a portion of the channel material layer over the gate stack pedestal.

2. The integrated circuit structure of claim 1, wherein the dielectric spacers comprise silicon nitride or silicon oxynitride.

3. The integrated circuit structure of claim 1, wherein channel material layer comprises a semiconducting oxide material.

4. The integrated circuit structure of claim 1, wherein channel material layer comprises polycrystalline silicon.

5. The integrated circuit structure of claim 1, wherein the gate dielectric sidewalls have a thickness less than a thickness of the first gate dielectric layer, and less than a thickness of the second gate dielectric layer.

6. The integrated circuit structure of claim 1, wherein the first gate dielectric layer, the second gate dielectric layer and the gate dielectric sidewalls are composed of a same material.

7. The integrated circuit structure of claim 1, wherein the first gate dielectric layer and the gate dielectric sidewalls are composed of a different material.

8. The integrated circuit structure of claim 7, wherein the second gate dielectric layer is composed of a different material than the first gate dielectric layer and the gate dielectric sidewalls.

9. The integrated circuit structure of claim 1, wherein the second source or drain contact is on at least a portion of the dielectric spacers.

10. The integrated circuit structure of claim 1, wherein the second source or drain contact is horizontally offset relative to the gate stack pedestal.

11. A method of fabricating an integrated circuit structure, the method comprising:
    forming a first source or drain contact above a substrate;
    forming a gate stack pedestal on the first source or drain contact, the gate stack pedestal comprising a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer;
    forming a channel material over and along sidewalls of the gate stack pedestal, the channel material further on the first source or drain contact;
    forming dielectric spacers adjacent portions of the channel material along the sidewalls of the gate stack pedestal and on a portion of the channel material on the first source or drain contact;

patterning the channel material on the first source or drain contact to form a channel material layer using the dielectric spacers as a mask; and forming a second source or drain contact over a portion of the channel material layer over the gate stack pedestal by etching a conductive layer, wherein the dielectric spacers are an etch stop during the etching.

12. The method of claim 11, wherein the dielectric spacers comprise silicon nitride or silicon oxynitride.

13. The method of claim 11, wherein channel material layer comprises a semiconducting oxide material.

14. The method of claim 11, wherein channel material layer comprises polycrystalline silicon.

15. An integrated circuit structure, comprising:

a first source or drain contact above a substrate;

a gate stack pedestal on the first source or drain contact, the gate stack pedestal comprising a first gate dielectric layer, a gate electrode layer on the first gate dielectric layer, a second gate dielectric layer on the gate electrode layer, and gate dielectric sidewalls along the first gate dielectric layer, the gate electrode layer and the second gate dielectric layer;

a channel material layer over and along sidewalls of the gate stack pedestal, the channel material layer further on a portion of the first source or drain contact;

first dielectric spacers adjacent portions of the channel material layer along the sidewalls of the gate stack pedestal, wherein the first dielectric spacers are passivating for the channel material layer;

second dielectric spacers adjacent the first dielectric spacers, wherein the second dielectric spacers have a higher etch resistance than the first dielectric spacers;

a second source or drain contact over a portion of the channel material layer over the gate stack pedestal.

16. The integrated circuit structure of claim 15, wherein the first dielectric spacers comprise a dopant species.

17. The integrated circuit structure of claim 15, wherein channel material layer comprises a semiconducting oxide material.

18. The integrated circuit structure of claim 15, wherein channel material layer comprises polycrystalline silicon.

19. The integrated circuit structure of claim 15, wherein the second source or drain contact is on at least a portion of the first and second dielectric spacers.

20. The integrated circuit structure of claim 15, wherein the second source or drain contact is horizontally offset relative to the gate stack pedestal.

* * * * *